United States Patent
Ahrens et al.

(10) Patent No.: US 9,171,918 B2
(45) Date of Patent: Oct. 27, 2015

(54) SEMICONDUCTOR DEVICE WITH AN ELECTRODE BURIED IN A CAVITY

(71) Applicant: Infineon Technologies Austria AG, Villach (AT)

(72) Inventors: Carsten Ahrens, Pettendorf (DE); Johannes Baumgartl, Riegersdorf (DE); Francisco Javier Santos Rodriguez, Villach (AT); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/332,438

(22) Filed: Jul. 16, 2014

(65) Prior Publication Data
US 2014/0327103 A1    Nov. 6, 2014

Related U.S. Application Data

(62) Division of application No. 13/220,284, filed on Aug. 29, 2011, now Pat. No. 8,816,503.

(51) Int. Cl.
| | |
|---|---|
| *H01L 23/498* | (2006.01) |
| *H01L 29/41* | (2006.01) |
| *H01L 23/535* | (2006.01) |
| *H01L 21/74* | (2006.01) |
| *H01L 21/28* | (2006.01) |

(52) U.S. Cl.
CPC .............. *H01L 29/41* (2013.01); *H01L 21/28* (2013.01); *H01L 21/743* (2013.01); *H01L 23/535* (2013.01)

(58) Field of Classification Search
None
See application file for complete search history.

(56) References Cited

U.S. PATENT DOCUMENTS

| | | | |
|---|---|---|---|
| 4,030,943 A | 6/1977 | Lee et al. | |
| 4,091,408 A * | 5/1978 | Lee et al. | 257/523 |
| 4,240,846 A | 12/1980 | Doyle | |
| 4,888,623 A | 12/1989 | Enomoto et al. | |
| 4,984,048 A | 1/1991 | Sagara et al. | |
| 5,023,196 A | 6/1991 | Johnsen et al. | |
| 5,134,448 A * | 7/1992 | Johnsen et al. | 257/330 |
| 5,188,973 A | 2/1993 | Omura et al. | |
| 5,331,199 A | 7/1994 | Chu et al. | |
| 6,284,604 B1 * | 9/2001 | Tihanyi | 438/268 |
| 6,562,642 B1 | 5/2003 | Cohen et al. | |

(Continued)

FOREIGN PATENT DOCUMENTS

| | | | |
|---|---|---|---|
| JP | 03089524 | * | 4/1991 |
| JP | 2010027796 A | | 2/2010 |

OTHER PUBLICATIONS

Lee, Ming-Chang M. et al., "3D Silicon Transformation using Hydrogen Annealing", Solid-State Sensor, Actuator and Microsystems Workshop, Hilton Head Island, South Carolina, Jun. 6-10, 2004.

(Continued)

*Primary Examiner* — Jaehwan Oh
(74) *Attorney, Agent, or Firm* — Murphy, Bilak & Homiller, PLLC

(57) ABSTRACT

A semiconductor device includes an active device region formed in an epitaxial layer disposed on a semiconductor substrate and a buried electrode disposed below the active device region in a cavity formed within the semiconductor substrate. The buried electrode includes an electrically conductive material different than the material of the semiconductor substrate.

13 Claims, 16 Drawing Sheets

(56) References Cited

U.S. PATENT DOCUMENTS

| | | | |
|---|---|---|---|
| 7,232,729 B1 * | 6/2007 | Wong | 438/301 |
| 7,301,207 B2 | 11/2007 | Kim et al. | |
| 7,427,793 B2 | 9/2008 | Walker et al. | |
| 7,579,234 B2 | 8/2009 | Lin | |
| 7,582,531 B2 | 9/2009 | Siemieniec et al. | |
| 7,948,029 B2 | 5/2011 | Bhalla et al. | |
| 8,021,926 B2 | 9/2011 | de Fresart et al. | |
| 8,058,128 B2 | 11/2011 | Lee et al. | |
| 8,120,074 B2 * | 2/2012 | Schulze et al. | 257/288 |
| 8,123,963 B2 | 2/2012 | Benzel et al. | |
| 8,217,476 B2 | 7/2012 | Kraft et al. | |
| 8,253,192 B2 * | 8/2012 | Bhalla et al. | 257/330 |
| 8,278,183 B2 | 10/2012 | Lerner | |
| 2003/0027393 A1 * | 2/2003 | Suguro | 438/287 |
| 2003/0077895 A1 | 4/2003 | Derraa et al. | |
| 2004/0018705 A1 | 1/2004 | Colson et al. | |
| 2005/0280113 A1 * | 12/2005 | Kim et al. | 257/501 |
| 2006/0021961 A1 | 2/2006 | Muchow et al. | |
| 2006/0091453 A1 * | 5/2006 | Matsuda et al. | 257/330 |
| 2006/0209887 A1 | 9/2006 | Bhalla et al. | |
| 2008/0033271 A1 | 2/2008 | Say et al. | |
| 2008/0164518 A1 | 7/2008 | Darwish | |
| 2008/0315330 A1 | 12/2008 | Walker et al. | |
| 2010/0032683 A1 | 2/2010 | Ikeda et al. | |
| 2010/0096694 A1 | 4/2010 | Goarin | |
| 2011/0068475 A1 | 3/2011 | de Fresart et al. | |
| 2011/0101416 A1 * | 5/2011 | Schulze et al. | 257/139 |
| 2011/0291103 A1 | 12/2011 | Mazzillo | |
| 2012/0037983 A1 | 2/2012 | Hshieh | |
| 2012/0098030 A1 * | 4/2012 | Schulze et al. | 257/139 |
| 2013/0320483 A1 | 12/2013 | Chen et al. | |

OTHER PUBLICATIONS

Lehmann, Volker, "Electrochemistry of Silicon", Electrochemistry of Silicon: Instrumentation, Science, Materials and Applications. Copyright 2002 Wiley-VCH Verlag GmbH, ISBNs: 3-527-29321-3 (Hardcover) 3-527-60027-2 (Electronic). pp. 6-17, 30-67 and 89-110.

* cited by examiner

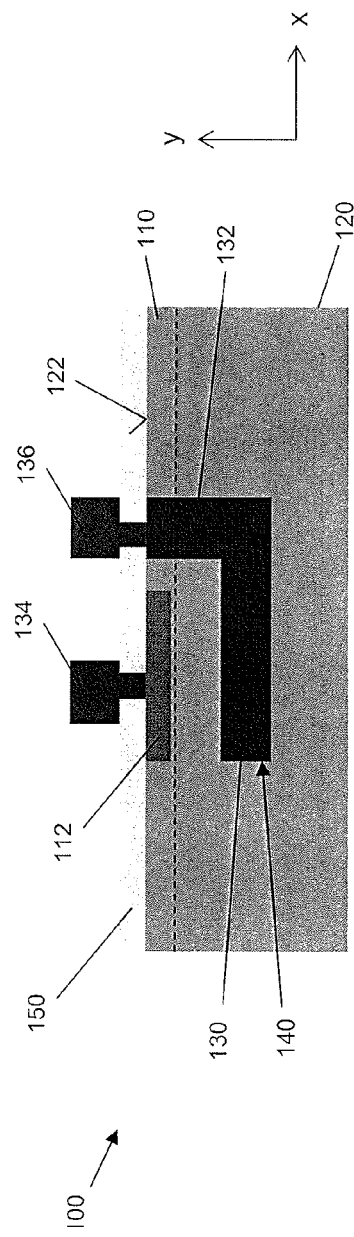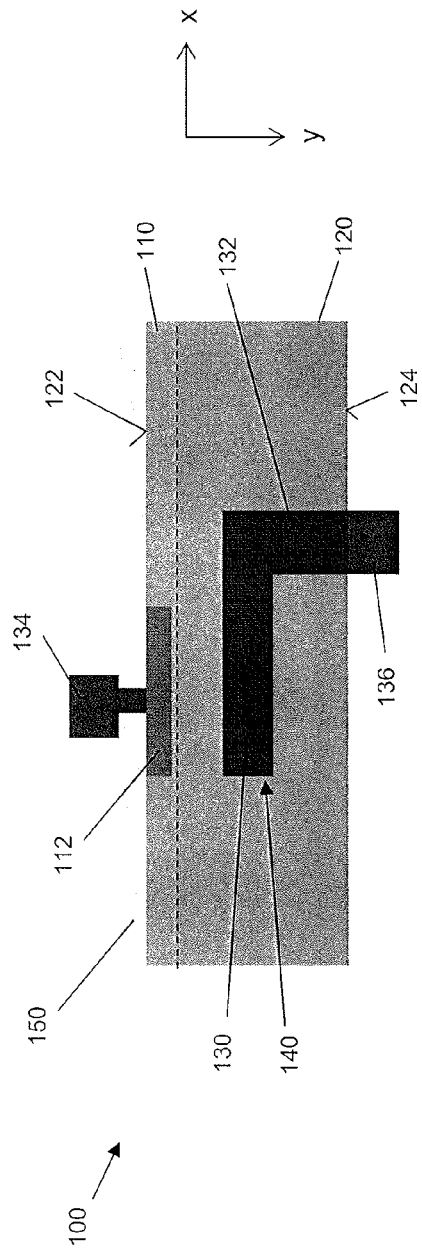

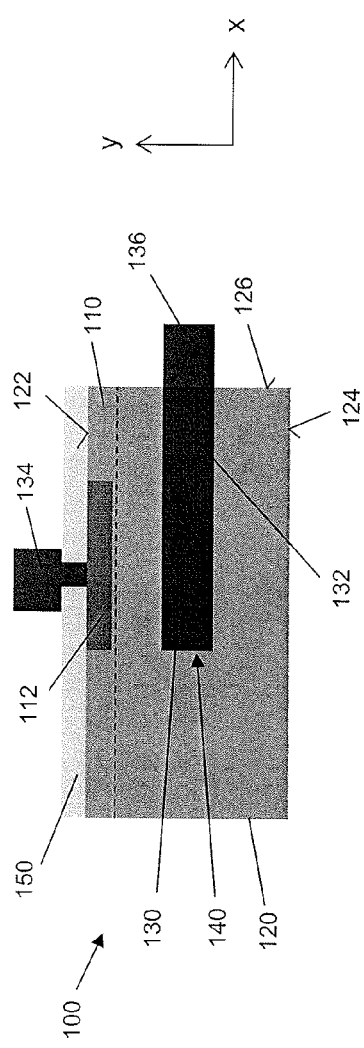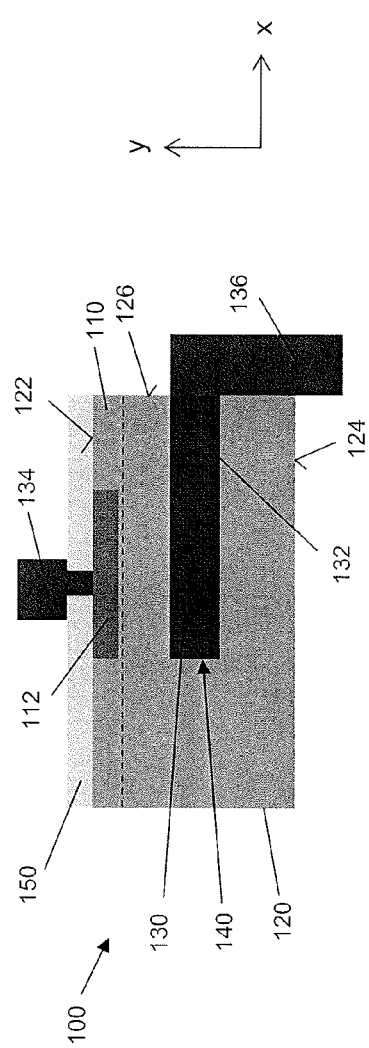

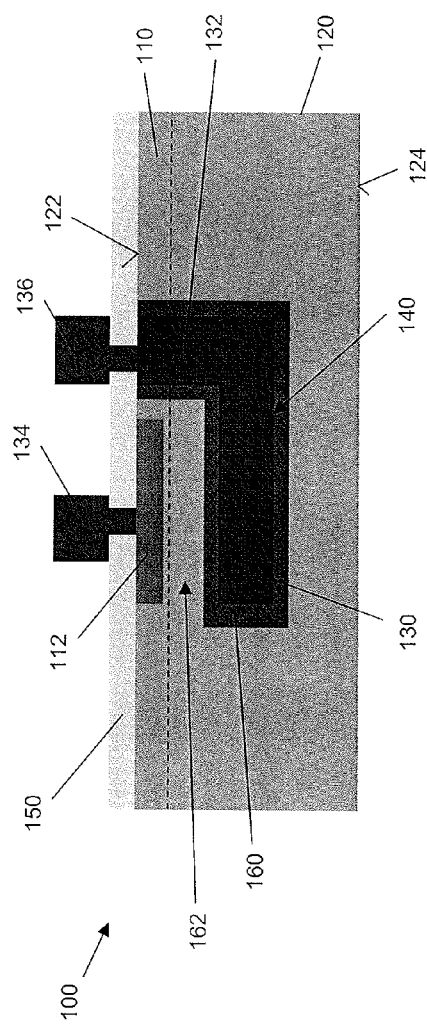
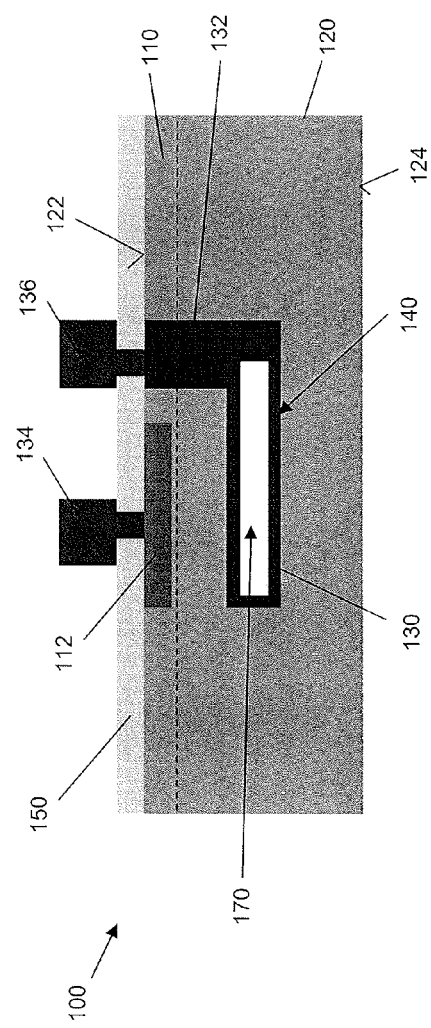
Figure 6
Figure 7

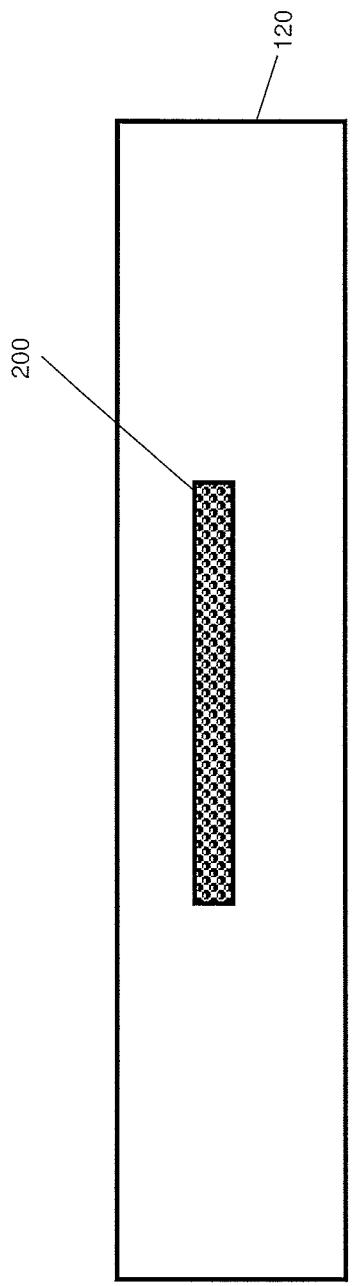

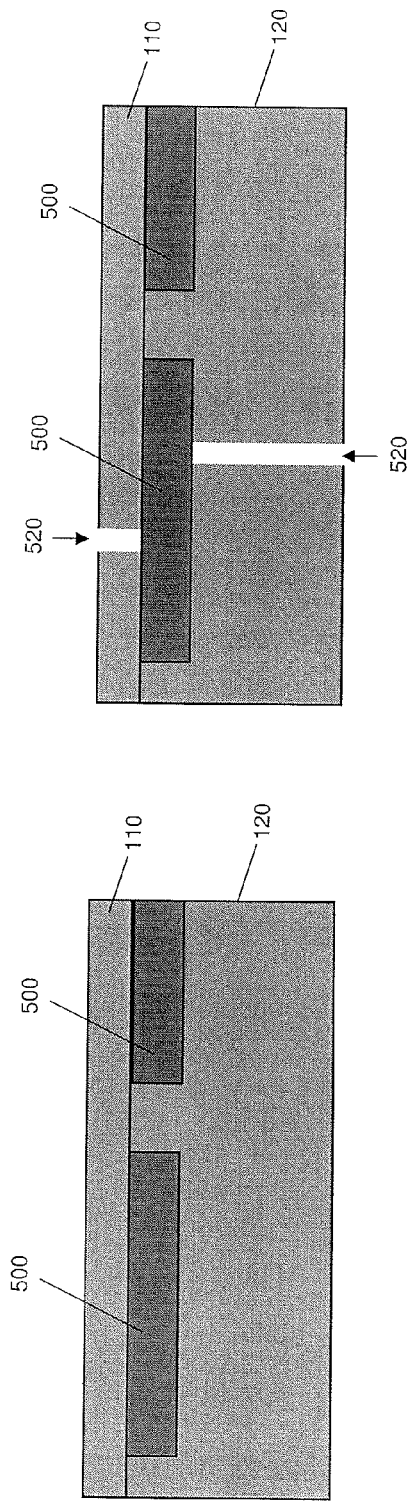
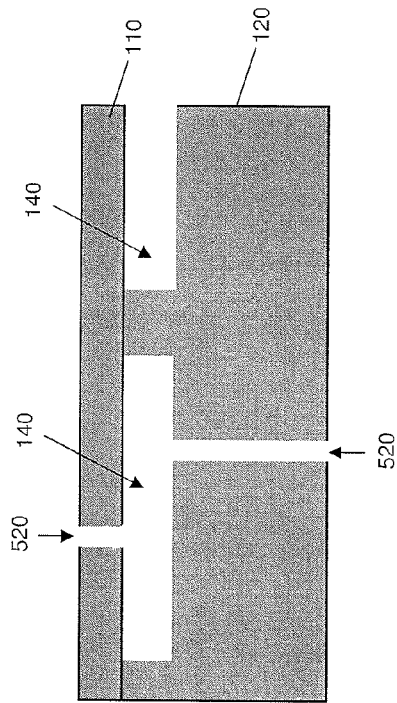
Figure 13A
Figure 13B
Figure 13C

SEMICONDUCTOR DEVICE WITH AN ELECTRODE BURIED IN A CAVITY

This application is a divisional of U.S. patent application Ser. No. 13/220,284 filed 29 Aug. 2011, the content of said application incorporated herein by reference in its entirety.

FIELD OF TECHNOLOGY

The present application relates to semiconductor devices, in particular semiconductor devices with buried electrodes.

BACKGROUND

Vertical semiconductor devices often have electrical connections on different sides of the device. The semiconductor substrate on which a vertical semiconductor device is fabricated can be thinned at its backside so that structures such as emitters, metal contacts or other devices can be formed at the thinned backside of the substrate. For example, an epitaxial layer is typically grown on a highly doped semiconductor substrate and various processes are carried out at the frontside to form an active device region which includes e.g. transistors. The backside of the substrate is then thinned and metal is deposited on the thinned backside to form an electrode. However, the silicon material which remains between the active device region at the frontside and the backside metallization adds resistance to the device. In another conventional approach, a dummy substrate is provided on which an epitaxial layer is grown. The active device region is formed in the epitaxial layer and the dummy substrate is thinned. Structures are then formed on the thinned backside. However, inhomogeneities associated with the substrate thinning process influence key device parameters such as breakdown voltage, forward voltage and on-resistance. Yield-critical vertical devices subjected to such backside processing are particularly sensitive to thickness variations in the active area which result due to variations associated with the thinning process.

In other approaches, the electrode structure is formed within the semiconductor substrate instead of thinning the substrate and depositing the electrode on the thinned backside. Conventional buried electrodes are formed within the semiconductor substrate by doping the substrate in a particular region. An epitaxial layer is grown on the substrate and an active device region is formed in the epitaxial layer. A sinker or trench contact is then formed in the substrate so that the buried layer can be electrically contacted. However, the sinker/trench contact and the buried layer structures both add resistance to the device.

SUMMARY

Embodiments described herein relate to a semiconductor device having a buried electrode disposed in a cavity previously formed in the semiconductor substrate. The electrode can be electrically connected at any side of the die surface.

According to an embodiment of a semiconductor device, the semiconductor device includes an active device region formed in an epitaxial layer disposed on a semiconductor substrate and a buried electrode disposed below the active device region in a cavity formed within the semiconductor substrate. The buried electrode comprises an electrically conductive material different than the material of the semiconductor substrate.

According to an embodiment of a method of manufacturing a semiconductor device, the method includes: forming a cavity within a semiconductor substrate; forming an active device region in an epitaxial layer disposed on the semiconductor substrate; and forming a buried electrode below the active device region in the cavity. The buried electrode comprises an electrically conductive material different than the material of the semiconductor substrate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1-7 illustrate perspective partial cross-sectional views of a semiconductor device with a buried electrode according to different embodiments.

FIGS. 8A-8G illustrate perspective partial cross-sectional views of a semiconductor substrate during different process steps of forming a buried electrode within the substrate.

FIGS. 13A-13C illustrate perspective partial cross-sectional views of a semiconductor substrate during different process steps of forming a cavity from a local buried doped layer formed within the substrate.

DETAILED DESCRIPTION

Figure 5:
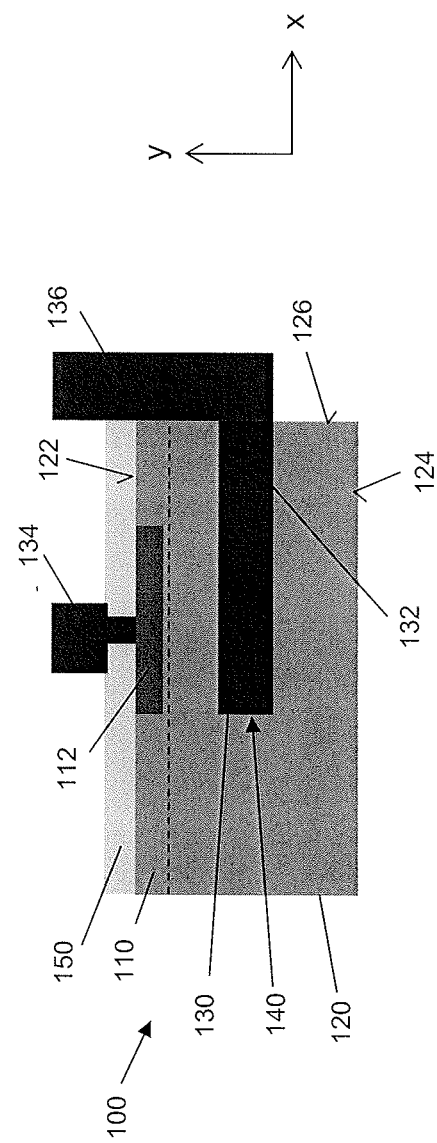

FIG. 1 illustrates an embodiment of a semiconductor device 100 which has an active device region 112 formed in an epitaxial layer 110 disposed on a semiconductor substrate 120 and a buried electrode 130 disposed within the substrate 120. The active device region 112 can include any type of active devices such as transistors, diodes, thyristors, etc. and any circuits formed from such devices. The active device region 112 therefore can include one or more doped regions of semiconductor material. The substrate 120 can be any type of semiconductor substrate such as a Si wafer, Si on insulator (SOI) wafer, SiC wafer, GaAs wafer, GaN wafer, or any other type of III-IV compound semiconductor wafer. The buried electrode 130 is disposed lower, but not necessarily directly vertically below the active device region 112 in a cavity 140 formed within the semiconductor substrate 120.

The buried electrode 130 comprises an electrically conductive material different than the material of the semiconductor substrate 120. In one embodiment, the buried electrode 130 comprises a metal. In another embodiment, the buried electrode 130 comprises TiN or Tungsten. In yet another embodiment, the buried electrode 130 comprises polysilicon or carbon. Still other conductive materials different that the substrate material can be used to form the buried electrode 130. Formation of the buried electrode 130 within the substrate 120 is described in more detail later herein.

An electrically conductive buried contact 132 is also provided which extends from the buried electrode 130 to a surface of the semiconductor substrate 120. The buried contact 132 forms an interconnection with the buried electrode 130. In FIG. 1, the buried contact 132 extends vertically (direction y) from the buried electrode 130 to the frontside 122 of the semiconductor substrate 120 at which the epitaxial layer 110 is disposed. Additional contacts 134, 136 can be formed above the epitaxial layer 110 which pass through an insulation layer 150 disposed on the epitaxial layer 110 to form respective connections to the active device region 112 and the buried contact 132.

FIG. 2 shows an embodiment of the semiconductor device 100 which is similar to the embodiment shown in FIG. 1. According to this embodiment however the buried contact 132 extends vertically (direction y) from the buried electrode 130 to a surface contact area 136 at the backside 124 of the semiconductor substrate 120 on which the epitaxial layer 110 is disposed. That is, the buried contact 132 extends from the buried electrode 130 forming a contact 136 at the backside 124 of the substrate 120 which may or may not be thinned. Additional contacts 134 can also be provided on top of the epitaxial layer 110.

FIG. 3 shows another embodiment of the semiconductor device 100 which is similar to the embodiment shown in FIG. 1. According to this embodiment however the contact 132 extends laterally (direction x) from the buried electrode 130 to a lateral side 126 of the semiconductor substrate 120. The lateral side 126 is disposed between the front and back sides 122, 124 of the substrate 120. This way, the buried electrode 130 can be electrically contacted via a surface contact 136 at a lateral side 126 of the substrate 120 instead of the frontside 122 or the backside 124.

FIG. 4 shows an embodiment of the semiconductor device 100 which is similar to the embodiment shown in FIG. 3. According to this embodiment the surface contact 136 connected to the buried contact 132 extends vertically (direction y) downward along the lateral side 126 of the semiconductor substrate 120 to the backside 124 of the substrate 120. This way, the buried electrode 130 can be electrically contacted at the backside 124 of the substrate 120.

FIG. 5 shows another embodiment of the semiconductor device 100 which is similar to the embodiment shown in FIG. 3. According to this embodiment the surface contact 136 connected to the buried contact 132 extends vertically (direction y) upward along the lateral side 126 of the semiconductor substrate 120 to the frontside 122 of the substrate 120. This way, the buried contact 132 can be electrically contacted at the frontside 122 of the substrate 120.

FIG. 6 shows an embodiment of the semiconductor device 100 which is similar to the embodiment shown in FIG. 1. According to this embodiment however the semiconductor substrate 120 is doped more heavily in a region 160 adjacent the buried electrode 130 and the buried contact 132 than in a region 162 of the substrate 120 between the active device region 112 and the more heavily doped region 160 of the semiconductor substrate material. The more heavily doped region 160 provides a low ohmic contact between the buried electrode 130 and the surrounding substrate material, avoiding a Schottky contact. The more heavily doped region 160 also prevents or limits a space charge layer which is formed in a blocking state from reaching the buried electrode 130, providing robust blocking operation. The more heavily doped region 160 can have the same doping type (e.g. n-type or p-type) as the substrate 120, or can have the opposite doping type of the substrate 120 to form a pn junction with the substrate 120. Such regional doping is described in more detail later herein with reference to FIG. 8D.

FIG. 7 shows another embodiment of the semiconductor device 100 which is similar to the embodiment shown in FIG. 1. According to this embodiment however the electrically conductive material of the buried electrode 130 is disposed along sidewalls of the cavity 140 formed in the semiconductor substrate 120 so that a cavity 170 is disposed in an inner part of the buried electrode 130. As such, the buried electrode 130 has an inner hollow region 170. The inner cavity 170 lowers the stress on the semiconductor material surrounding the buried electrode 130 if the buried electrode 130 is not completely filled with a conductive material which can occur e.g. if a conformal CVD (chemical vapor deposition) process is used to form the buried electrode 130. Formation of the inner cavity 170 is described in more detail later herein with reference to FIG. 8G.

Figure 8B:
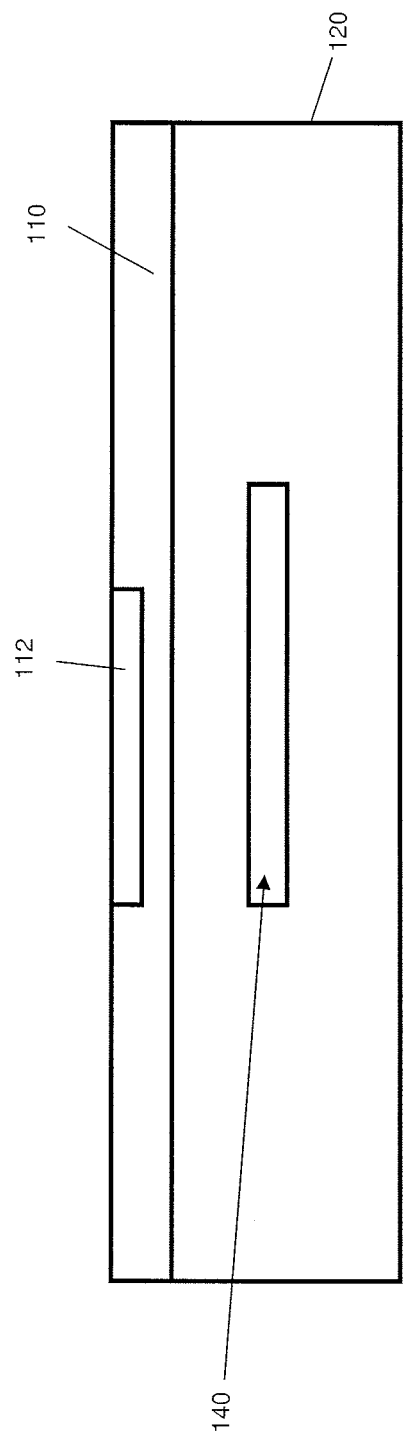

FIGS. 8A-8G illustrates different steps associated with various embodiments for manufacturing the semiconductor device 100 with the buried electrode 130 disposed below the active device region 112 in the cavity 140 formed within the semiconductor substrate 120. FIG. 8A shows the semiconductor substrate 120 with a porous region 200 formed in the substrate 120. Any conventional technique can be used to form the porous region 200. For example, for a Si wafer, an electrochemical pore formation process can be used to grow pores in the Si substrate 120. In FIG. 8B an epitaxial layer 110 is then subsequently formed on the semiconductor substrate 120 in order to provide for an active device region 112. The epitaxial layer 110 is grown at a temperature high enough to form a cavity 140 from the porous region 200. That is, the elevated temperature associated with epitaxy process causes the porous region 200 to revert to a cavity 140 within the substrate 120. Alternatively a so-called H2-bake can be used in the temperature range of 1000 to 1200° C. for some minutes to form the cavity 140 before an epitaxial deposition. This way, the cavity forming process can be decoupled from the epitaxial growth process which may be necessary for thin epitaxial layers and/or minimizing dopant diffusion effects in the epitaxial layer 110.

Figure 8C:
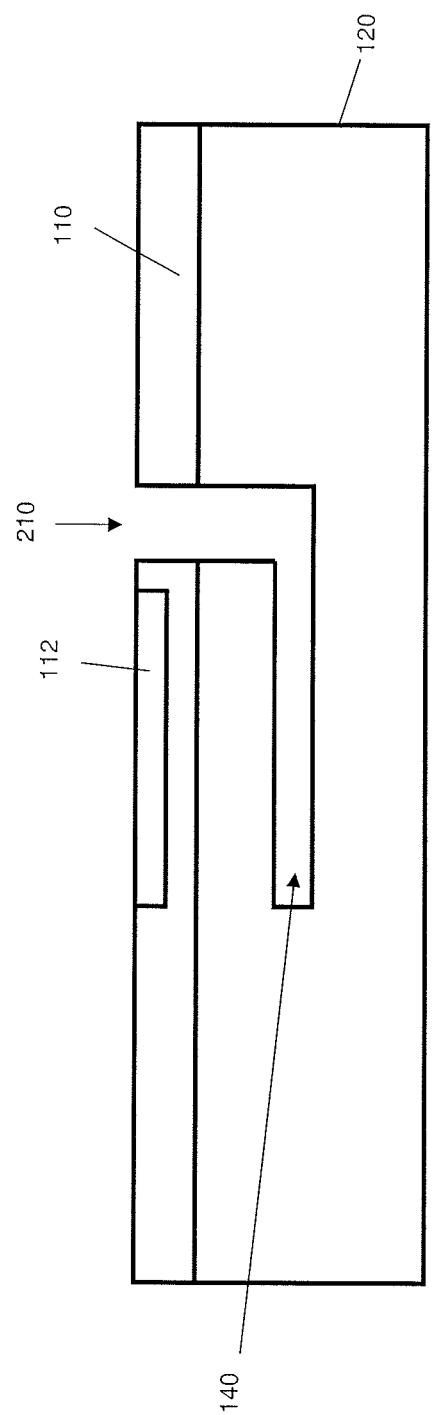
Figure 8D:
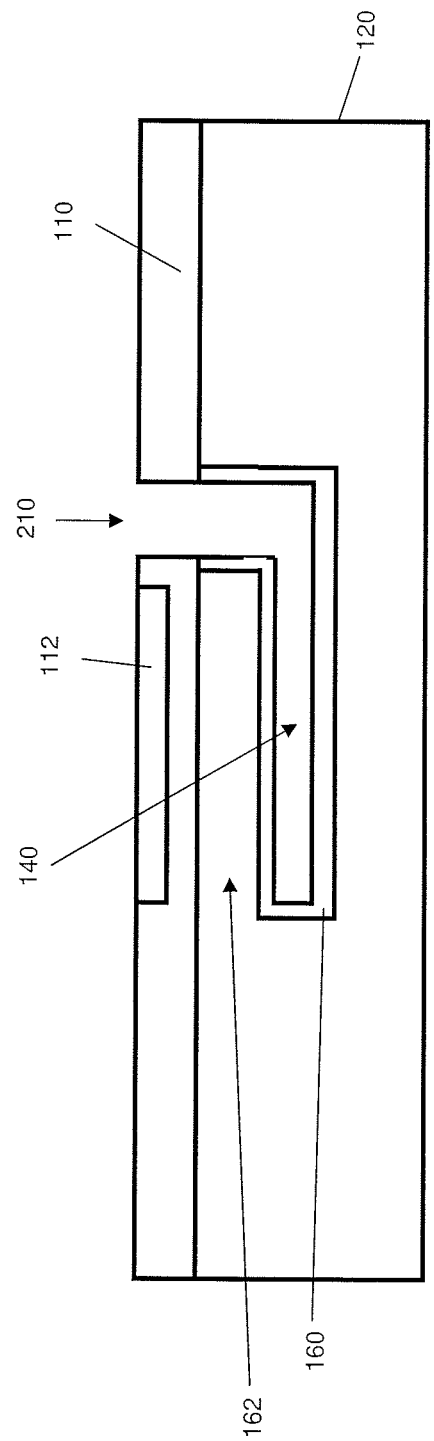

FIG. 8C shows the semiconductor substrate 120 after a trench 210 is etched into the substrate 120 which extends to the cavity 140 formed within the substrate 120. The etching can be performed wet or dry chemically using masks or selective processes. The trench 210 opens the cavity 140 for filling with a conductive material. Prior to filling of the cavity 140, the material of the semiconductor substrate 120 optionally can be doped more heavily in a region 160 adjacent the cavity 140 than in a region 162 of the substrate 120 between the active device region 112 and the more heavily doped region 160 of the substrate material as shown in FIG. 8D. According to one embodiment, this region 160 of the semiconductor substrate 120 adjacent the cavity 140 is doped more heavily by introducing dopants from the process gas atmosphere by diffusion before the buried electrode 130 is formed in the cavity 140. An additional diffusion process may be needed to activate the dopants.

Figure 8E:
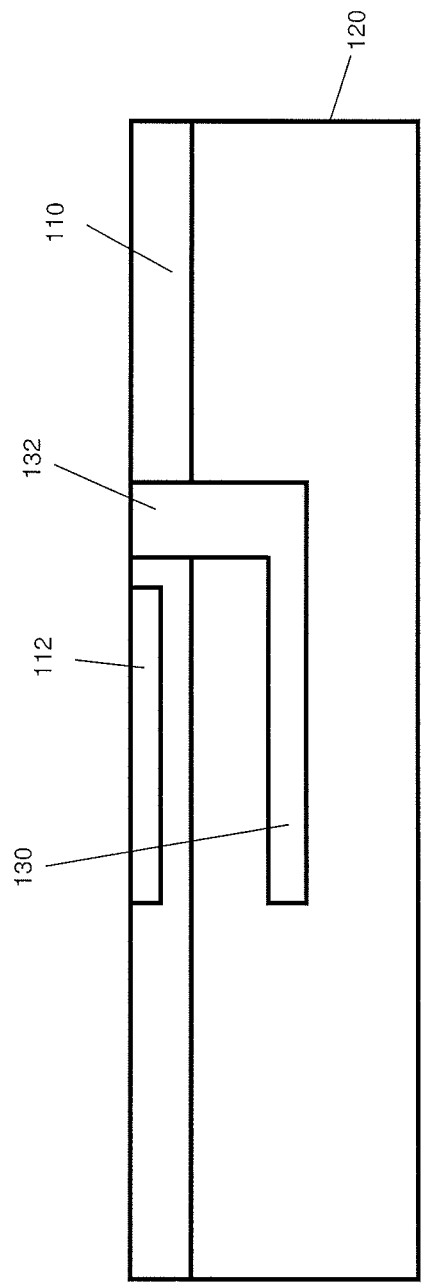

FIG. 8E shows the semiconductor substrate 120 after the open cavity 140 is filled with an electrically conductive material to form the buried electrode 130 below the active device region 112 in the cavity 140 and the buried contact 132 connected to the buried electrode 130. The buried electrode 130 can be formed by filling the open cavity 140 with a conductive material different than the material of the substrate 120 e.g. such as a metal, TiN, Tungsten, polysilicon, carbon, etc. The buried electrode material can be deposited into the cavity 140 using a CVD process, an atomic layer deposition process or a wetting process such as melting metal which at least partly fills the cavity 140 via a capillary effect. The buried contact 132 which forms an interconnection to the buried electrode 130 can be formed by a sputtering or plating process. The contact 132 extends from the buried electrode 130 to a surface of the semiconductor substrate 120 as previously described herein.

Figure 8F:
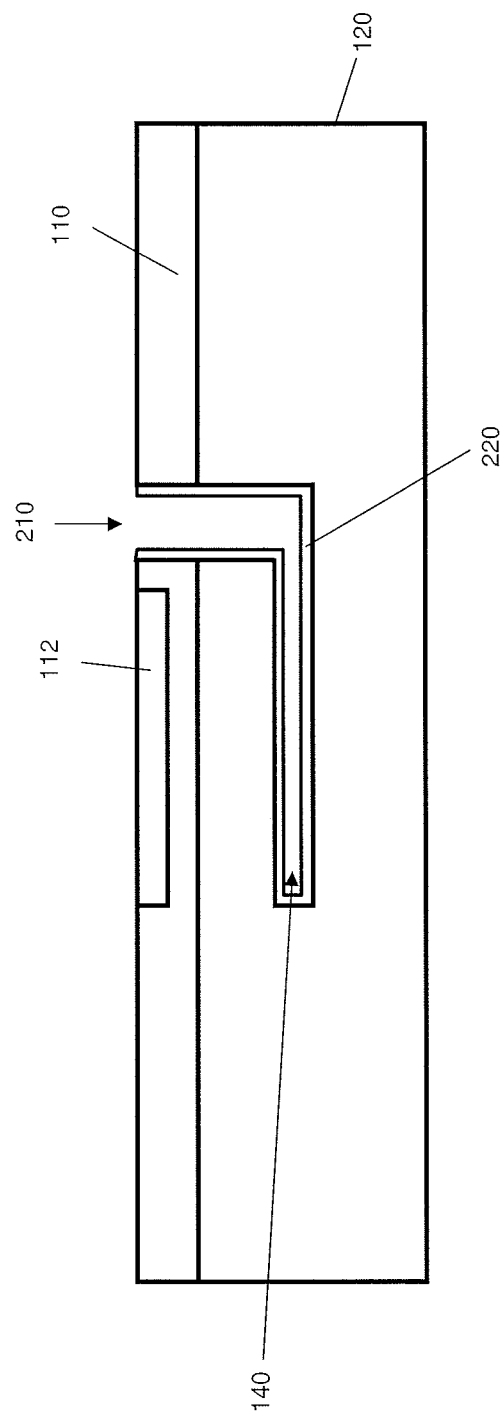
Figure 8G:
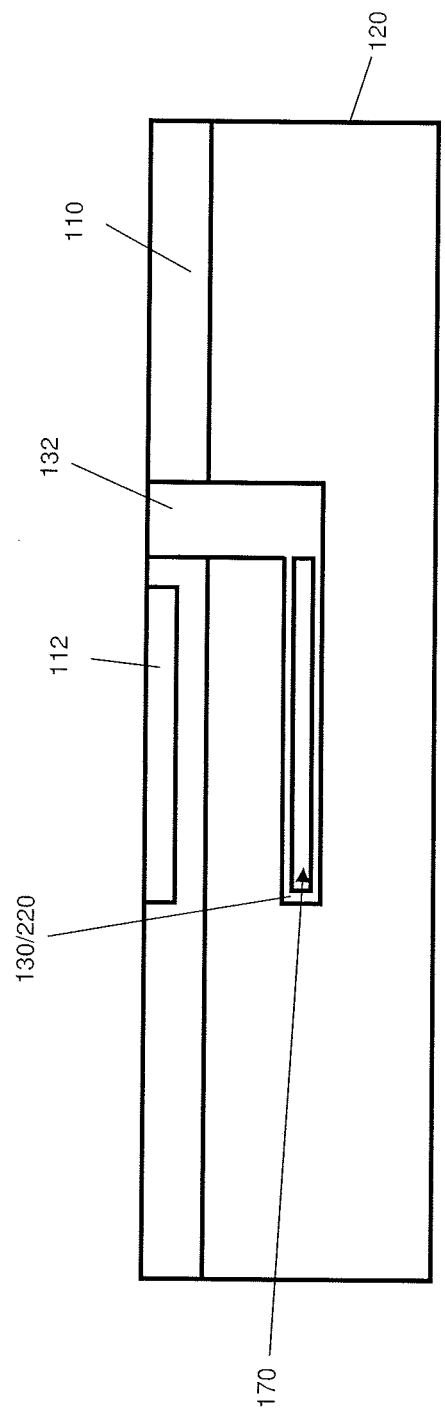

FIG. 8F shows the cavity 140 after a conformal CVD process is used to partly fill the open cavity 140. The conformal CVD process yields an electrically conductive material 220 which is disposed along the sidewalls of the cavity 140 so that an inner part of the buried electrode 130 has an unfilled cavity. FIG. 8G shows the cavity 170 after the buried contact 132 is formed to the buried electrode 130/220. The buried contact 132 can be formed by a sputtering process or any other suitable process. Standard processing can be employed after the buried electrode 130 and contact 132 are formed e.g. to yield the semiconductor devices 100 shown in FIGS. 1-7.

Figure 9:
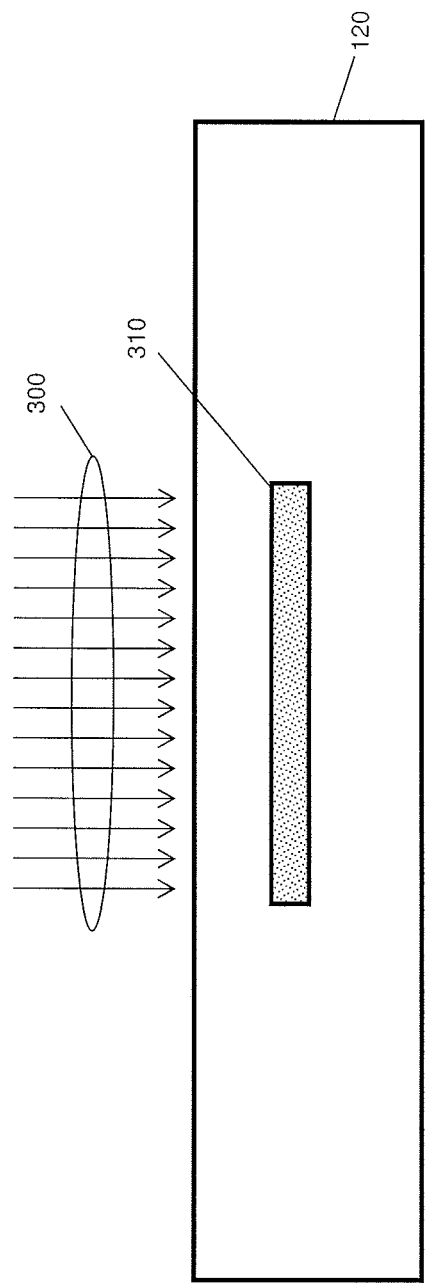
FIG. 9 illustrates a perspective partial cross-sectional view of a semiconductor substrate during formation of a buried electrode within the substrate according to another embodiment.

FIG. 9 shows another embodiment for forming the cavity 140 within the semiconductor substrate 120. According to this embodiment, the cavity 140 is formed by irradiating a region of the semiconductor substrate 120 with protons 300 to form an irradiated region 310 in the substrate 120. The substrate 120 is subsequently annealed at a temperature high enough to form a cavity 140 from the irradiated region 310. The annealing process e.g. at 400 to 900° C. for a few minutes or a few hours causes the cavity 140 to form within the substrate 120 in the area of the irradiated region 310.

Figure 10:
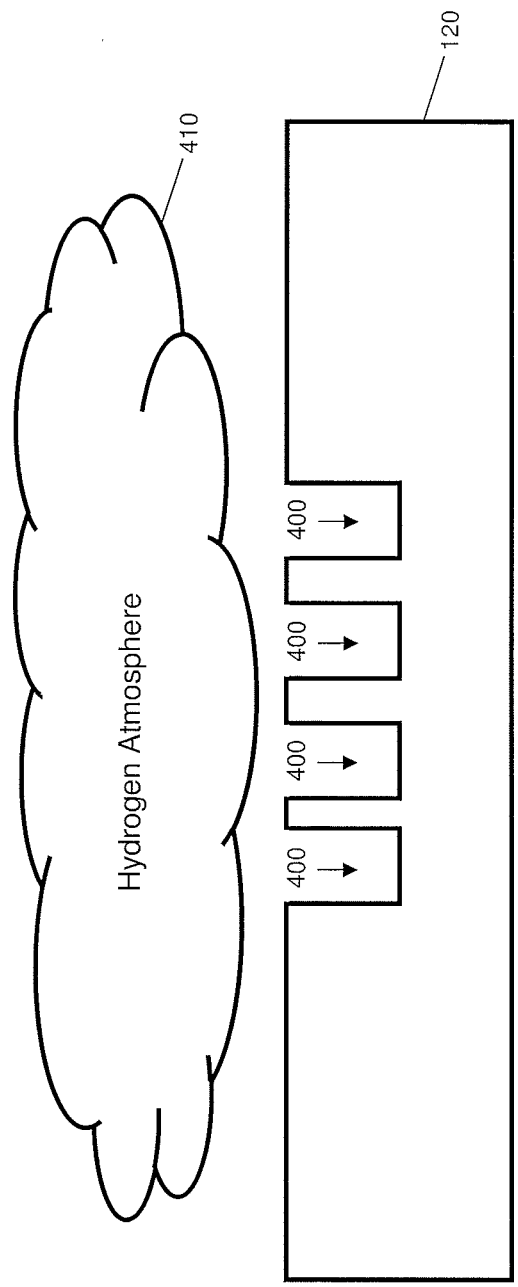
FIG. 10 illustrates a perspective partial cross-sectional view of a semiconductor substrate during formation of a buried electrode within the substrate according to yet another embodiment.

FIG. 10 shows yet another embodiment for forming the cavity 140 within the semiconductor substrate 120. According to this embodiment, the cavity 140 is formed by etching trenches 400 into the semiconductor substrate 120 and subsequently annealing the substrate 120 at an elevated temperature in a hydrogen atmosphere 410. Annealing in a hydrogen atmosphere 410 causes the cavity 140 to form within the substrate 120 in the region of the trenches 400.

Figure 11A:
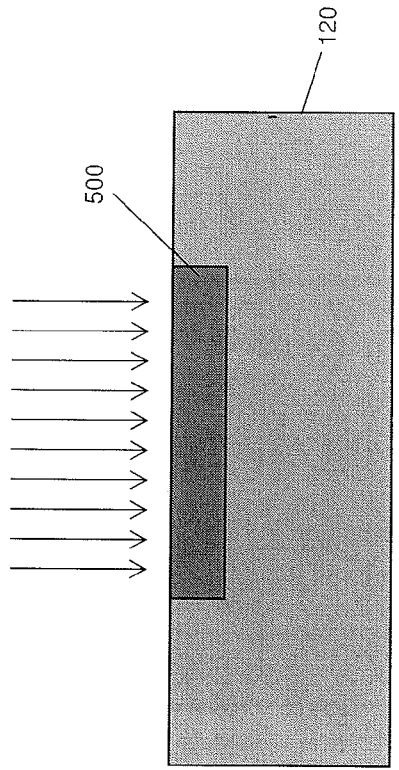
FIGS. 11A-11C illustrate perspective partial cross-sectional views of a semiconductor substrate during different process steps of forming a local buried doped layer within the substrate.
Figure 11B:
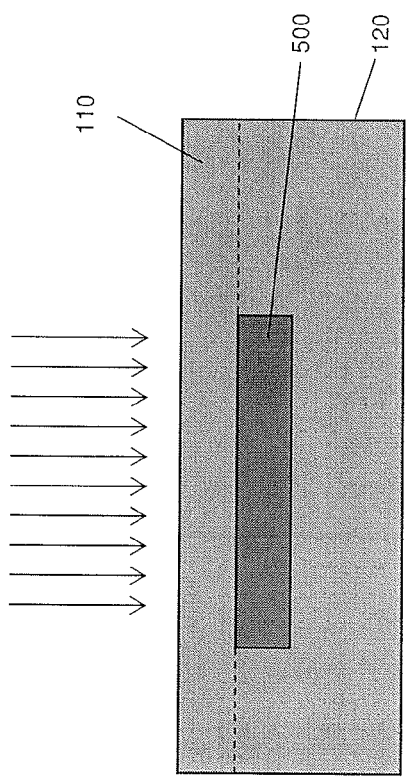
Figure 11C:
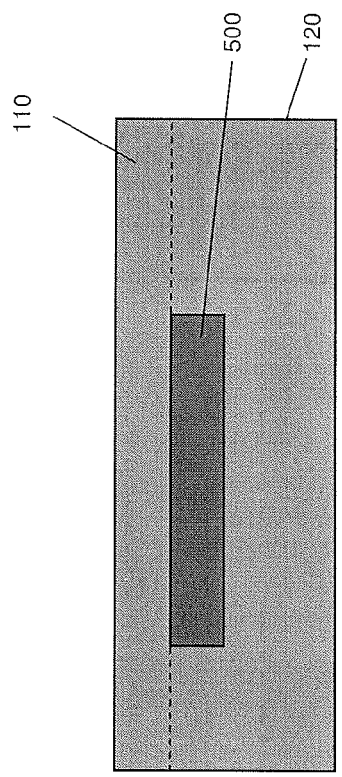

FIGS. 11A-11C illustrate different steps associated with an embodiment of a method of forming a local buried doped layer 500 within the substrate 120 and having the opposite doping type as the surrounding semiconductor material, in order to subsequently form the cavity 140 within the substrate 120. In FIG. 11A the doping of the local buried layer 500 is achieved via implantation with dopants of the opposite conductivity type as the surrounding substrate material and annealing (the implantation process is indicated by downward facing arrows). The complementary implantation can be performed after the epitaxial layer 110 is formed on the substrate 120 as shown in FIG. 11A. Alternatively, the complementary implantation is performed prior to the epitaxy process as shown in FIG. 11B, and the epitaxial layer 110 is grown after the implantation process as shown in FIG. 11C.

Figure 12A:
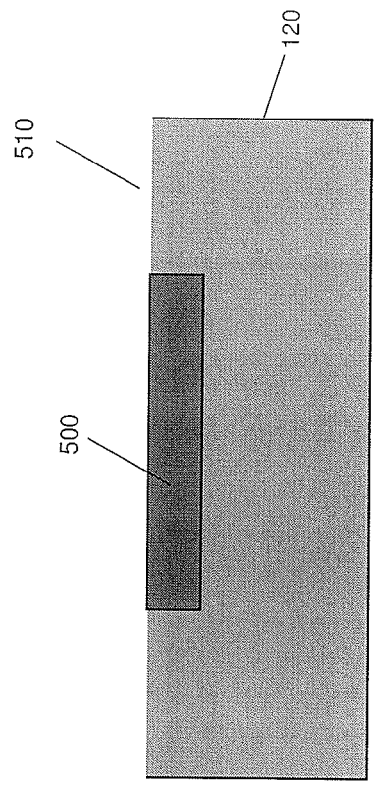
FIGS. 12A-12C illustrate perspective partial cross-sectional views of a semiconductor substrate during different process steps of forming a local buried doped layer within the substrate according to another embodiment.
Figure 12B:
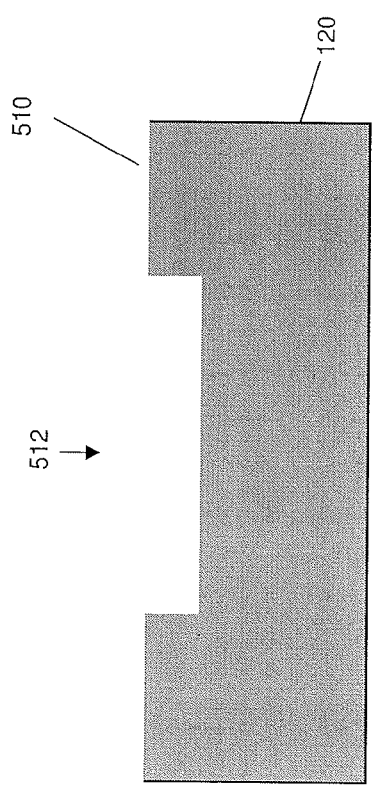
Figure 12C:
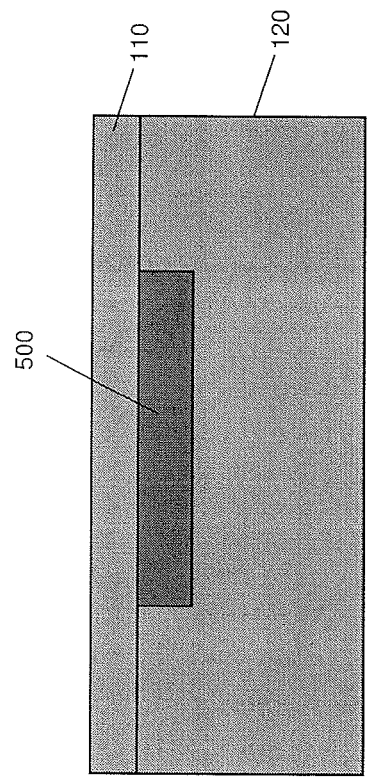

FIGS. 12A-12C illustrate different steps associated with another embodiment of a method of forming the local buried doped layer 500 within the substrate 120 and having the opposite doping type as the surrounding material of the substrate 120, in order to subsequently form the cavity 140 within the substrate 120. According to this embodiment, highly doped oxide or gas phase doping is used to provide a mask 510 on the substrate 120 and the substrate 120 is then etched to form a recessed region 512 as shown in FIG. 12A. A selective epitaxy process is performed to form the local buried doped layer 500 in the recessed region 512 as shown in FIG. 12B. The mask 510 is then removed and the epitaxial layer 110 grown on the substrate 120 and buried doped layer 500 as shown in FIG. 12C. Instead of a doped epitaxy, a SiGe selective epitaxy (doped or undoped) can also be used to create a chemically different semiconductor region on top of the substrate 120. At least in the cases of diffusion or selective epitaxy the top of the substrate 120 is covered with an epitaxy layer 110 having the same type of doping (conductivity type) as the substrate 120.

FIGS. 13A-13C show another embodiment of forming the cavity 140 within the semiconductor substrate 120 by using the local buried doped layer 500. FIG. 13A shows the substrate 120 prior to cavity formation, with the local buried doped layer 500 formed below the epitaxial layer 110 e.g. in accordance with the embodiments described above with reference to FIGS. 11 and 12. The local buried doped layer 500 has the opposite doping type as the surrounding semiconductor material also as described above. Vias 520 are etched through the top epitaxial layer 110 or the undoped substrate top layer to allow wet chemical contact of the etching solution with the local buried doped layer 500. The vias 520 can also be formed from the backside 124 of the substrate 120. The contact area for etching can also be formed from the side walls of the substrate 120 (after wafer dicing, which produces multiple die) if the buried regions 500 extend to the edge of the diced die. An etching process which stops at a pn junction formed between the buried doped layer 500 and the surrounding semiconductor material is subsequently performed to form the cavity 140 within the substrate 120 as shown in FIG. 13C. In case of a SiGe buried layer region 500, an etching solution with a high selectivity between Si and SiGe can be used. The vias 520 used for etching access can be closed after etching if desired (e.g. using a dielectric or epitaxy process) or can be used for the subsequent cavity filling process previously described herein.

In each case, the buried electrode 130 has low electrical and/or thermal resistance and a low resistance connection is provided to the buried electrode 130. Also, low thickness variations in the active device region 112 arise late in the processing of the buried electrode 130 and enable steep doping profiles in the active device region 112.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
 an active device region formed in an epitaxial layer disposed on a semiconductor substrate;
  a buried electrode disposed below the active device region in a cavity formed within the semiconductor substrate, the buried electrode comprising an electrically conductive material different than the material of the semiconductor substrate, and
  an electrically conductive contact which extends from the buried electrode to a surface of the semiconductor substrate,
  wherein the material of the semiconductor substrate is doped more heavily in a region adjacent the buried electrode than in a region of the semiconductor substrate between the active device region and the more heavily doped region of the semiconductor substrate material.

2. The semiconductor device of claim 1, wherein the buried electrode comprises a metal material.

3. The semiconductor device of claim 2, wherein the buried electrode comprises TiN or Tungsten.

4. The semiconductor device of claim 1, wherein the buried electrode comprises polysilicon.

5. The semiconductor device of claim 1, wherein the buried electrode comprises carbon.

6. The semiconductor device of claim 1, wherein the contact extends vertically from the buried electrode to the surface of the semiconductor substrate on which the epitaxial layer is disposed.

7. The semiconductor device of claim 1, wherein the contact extends vertically from the buried electrode to the opposite surface of the semiconductor substrate on which the epitaxial layer is disposed.

8. The semiconductor device of claim 1, wherein the contact extends laterally from the buried electrode to a side surface of the semiconductor substrate which is disposed between top and bottom surfaces of the semiconductor substrate.

9. The semiconductor device of claim 1, wherein the electrically conductive material of the buried electrode is disposed along sidewalls of the cavity formed in the semiconductor substrate so that a cavity is disposed in an inner part of the buried electrode.

10. The semiconductor device of claim 1, wherein the buried electrode is in low ohmic or Schottky contact with the semiconductor substrate.

11. The semiconductor device of claim 1, wherein the active device region is formed at a surface of the epitaxial layer directly over the cavity such that the cavity is spaced apart from the active device region by a portion of the epitaxial layer in a direction perpendicular to the surface.

12. The semiconductor device of claim 11, wherein the buried electrode is directly underneath the active device region in the cavity.

13. A semiconductor device, comprising:
 an active device region formed in an epitaxial layer disposed on a semiconductor substrate;
 a buried electrode disposed below the active device region in a cavity formed within the semiconductor substrate, the buried electrode comprising an electrically conductive material different than the material of the semiconductor substrate, and
 an electrically conductive contact which extends from the buried electrode to a surface of the semiconductor substrate,
 wherein the contact extends vertically from the buried electrode to the opposite surface of the semiconductor substrate on which the epitaxial layer is disposed.

* * * * *